(12) United States Patent
Opitz

(10) Patent No.: US 10,094,865 B2
(45) Date of Patent: Oct. 9, 2018

(54) TEST CHAMBER FOR ELECTROMAGNETIC COMPATIBILITY MEASUREMENT AND TEST CHAMBER VALIDATION METHOD

(71) Applicant: Wolfgang Opitz, Heideck (DE)

(72) Inventor: Wolfgang Opitz, Heideck (DE)

( * ) Notice: Subject to any disclaimer, the term of this patent is extended or adjusted under 35 U.S.C. 154(b) by 60 days.

(21) Appl. No.: 15/051,885

(22) Filed: Feb. 24, 2016

(65) Prior Publication Data
US 2016/0252554 A1 Sep. 1, 2016

(30) Foreign Application Priority Data

Feb. 24, 2015 (DE) .................. 10 2015 102 636

(51) Int. Cl.
*G01R 31/00* (2006.01)
*G01R 29/08* (2006.01)
(Continued)

(52) U.S. Cl.
CPC ............. *G01R 31/001* (2013.01); *G01R 1/04* (2013.01); *G01R 1/18* (2013.01); *G01R 29/0821* (2013.01)

(58) Field of Classification Search
CPC .......................... G01R 31/001; G01R 29/0821; G01R 29/105; G01R 29/0871; G01R 1/04; G01R 1/18; G01R 29/0878; G01R 29/0892; G01R 29/10; G01R 31/002; G01R 31/2822; G01R 29/08; G01R 29/0814; G01R 31/315; G01R 31/2843; G01R 31/3025; G01R 35/00; G01R 29/0828; G01R 31/2849; H01Q 21/30; H01Q 21/065; H01Q 21/08;
(Continued)

(56) References Cited

U.S. PATENT DOCUMENTS 3,120,641 A 2/1964 Buckley
5,532,704 A * 7/1996 Ruelle .................. G01R 29/105
174/384

(Continued)

FOREIGN PATENT DOCUMENTS

CN 201589796 U 9/2010
CN 202710622 U 1/2013
(Continued)

*Primary Examiner* — Vinh Nguyen
(74) *Attorney, Agent, or Firm* — Laurence A. Greenberg; Werner H. Stemer; Ralph E. Locher

(57) ABSTRACT

A test chamber for EMC measurement testing, a method for the validation and a method for performing EMC measurement tests in such a test chamber. In order to simplify the validation of an EMC test chamber and the performance of different EMC measurement test procedures in a single test chamber, the novel test chamber for the EMC measurement test is configured for performing different EMC measurement test procedures by providing a plurality of measurement arrangements with different measurement axes. A plurality of antennas are simultaneously arranged in the test chamber. Each of these antennas is assigned in each case to at least one of the measurement test procedures. In order to provide the measurement arrangement for the given measurement test procedure, each of these antennas can be moved from a rest position into a measurement position assigned to the measurement arrangement and back again.

14 Claims, 4 Drawing Sheets

(51) Int. Cl.
  *G01R 1/04* (2006.01)
  *G01R 1/18* (2006.01)
(58) Field of Classification Search
  CPC ............ H01Q 21/29; H01Q 3/28; H01Q 3/30;
      H01Q 17/00; H01Q 19/17; H01Q 9/42;
      G01S 5/06
  See application file for complete search history.

(56) References Cited

U.S. PATENT DOCUMENTS

| 2006/0017428 | A1  | 1/2006  | Lin et al. |
| 2013/0059545 | A1  | 3/2013  | Kyösti et al. |
| 2013/0171945 | A1* | 7/2013  | Yang .................. G01R 29/0814 455/67.13 |
| 2013/0335253 | A1* | 12/2013 | Ho ....................... G01R 29/105 342/1 |

FOREIGN PATENT DOCUMENTS

| CN | 103487672 A | 1/2014 |
| JP | 2004163372 A | 6/2004 |
| JP | 2011095221 A | 5/2011 |

* cited by examiner

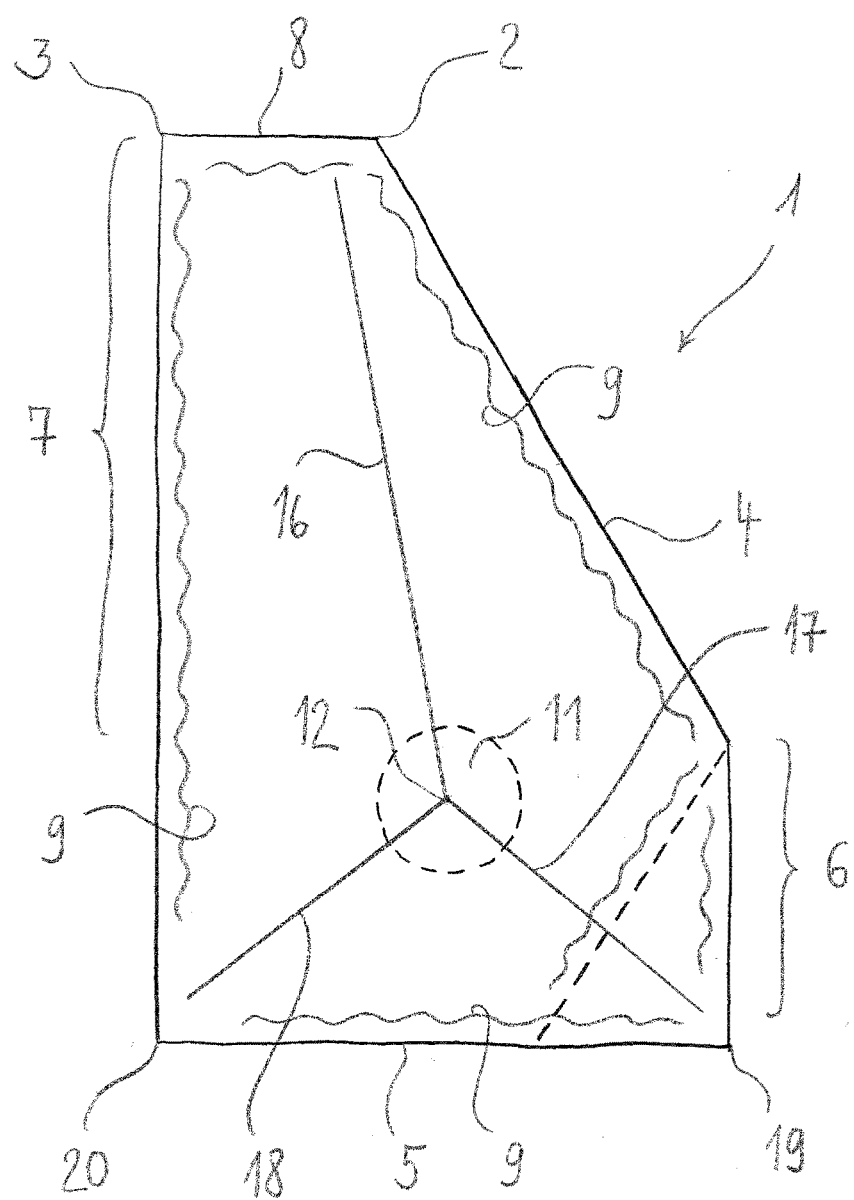

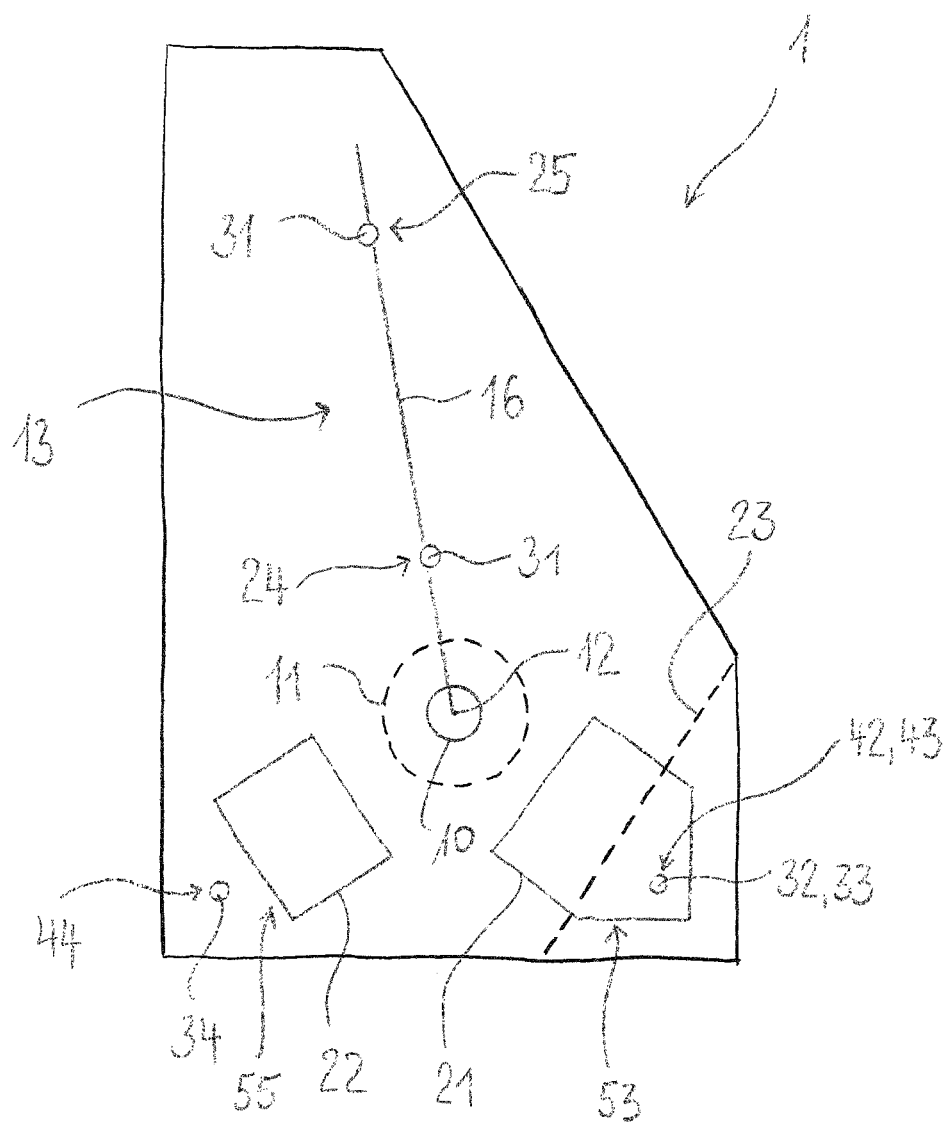

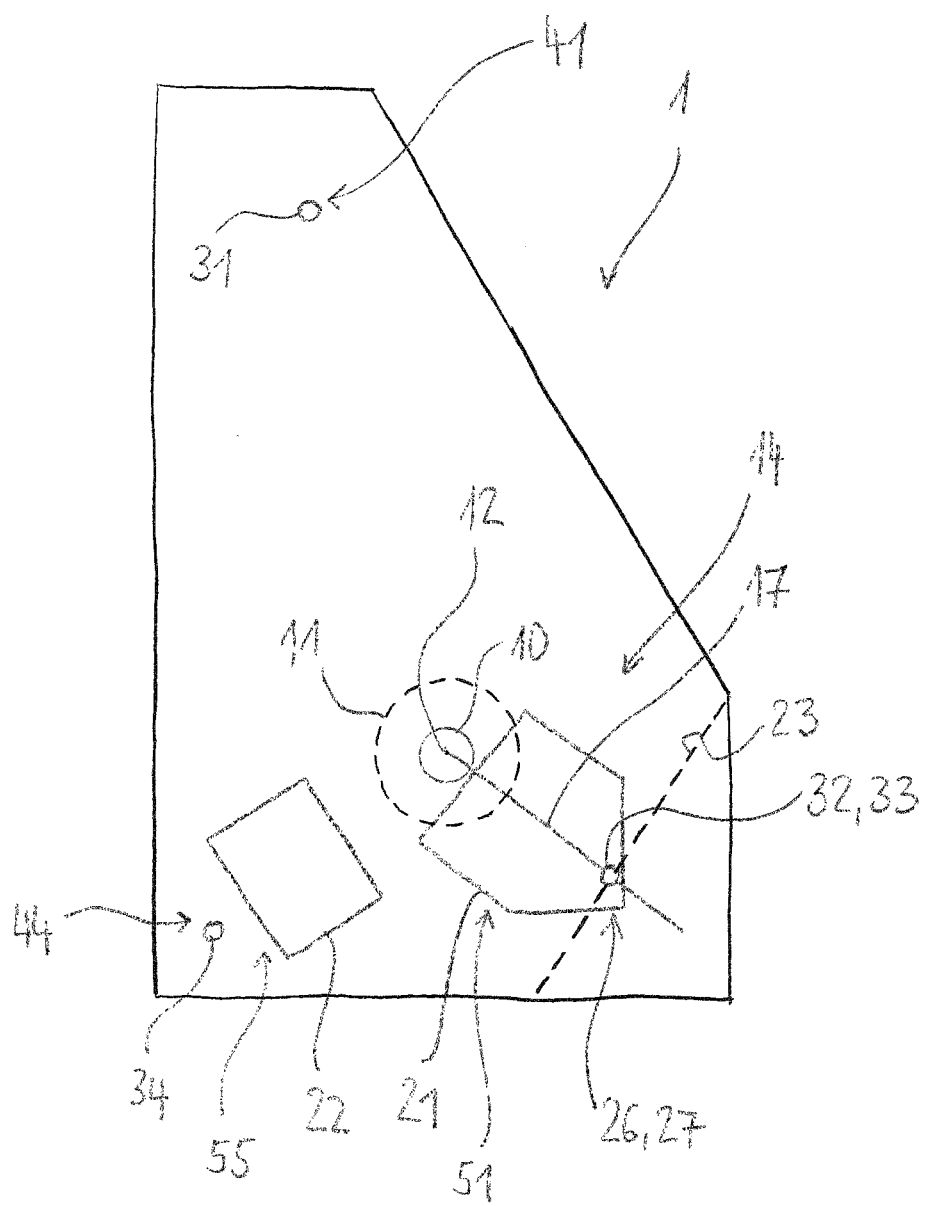

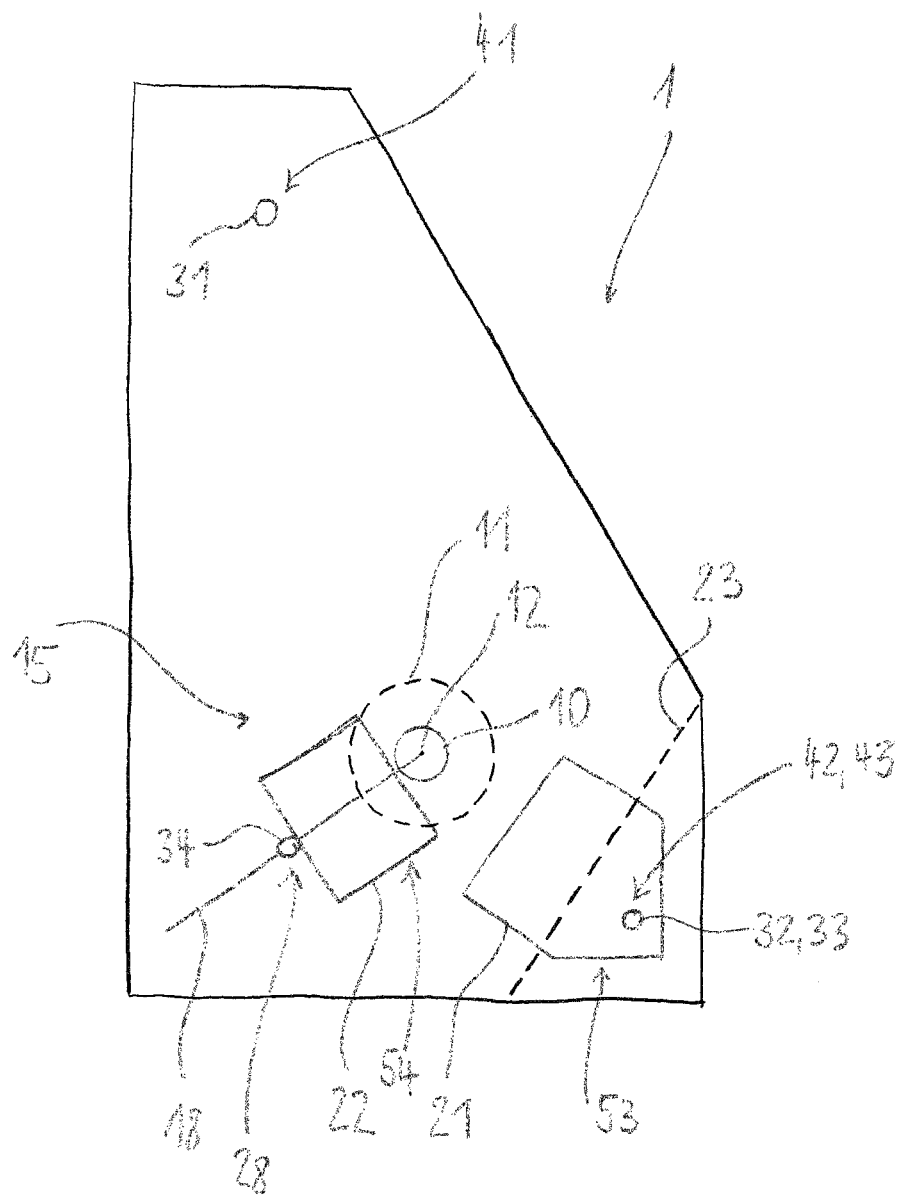

TEST CHAMBER FOR ELECTROMAGNETIC COMPATIBILITY MEASUREMENT AND TEST CHAMBER VALIDATION METHOD

BACKGROUND OF THE INVENTION

Field of the Invention

The invention relates to a test chamber for the EMC measurement test, a method for the validation of such a test chamber and a method for performing EMC measurement tests in such a test chamber.

The electromagnetic compatibility (EMC) of electrical and electronic devices is subject to strict test requirements. The emitted interference (emission) and the interference immunity (immunity) of these devices are tested in a suitable test chamber. Measurement procedures and threshold values for the EMC measurement test are regulated in the relevant standards. The latter are known to the person skilled in the art and there is therefore no need to deal further with them at this point.

The prerequisite for such a standard-compliant EMC measurement test is always a validated, standard-compliant test chamber. To this end, the test chamber must satisfy specific validation standards, which will be explained in greater detail below.

To test the emitted interference in a frequency range between 30 MHz and 1 GHz in the validation of the test chamber, the normalized site attenuation (NSA) is tested at measurement distances of three meters and ten meters according to the validation standards CISPR 16-1-4/EN 55016-1-4 and ANSI C63.4 in a test chamber with a metallic floor reference, i.e. without floor absorbers.

To test the emitted interference in a frequency range from 1 GHz to 18 GHz in the validation of the test chamber, the SVSWR (Site Voltage Standing Wave Ratio) is tested according to the validation standard CISPR 16-1-4/EN 55016-1-4. Floor absorbers are used here.

To test the interference immunity in a frequency range from 80 MHz to 18 GHz in the validation of the test chamber, the field uniformity is tested according to the validation standard EN 61000-4-3 in two frequency ranges from 1 to 18 GHz and from 80 MHz to 1 GHz. Floor absorbers are also used here.

Each of these validation tests for the validation of the test chamber requires for a standard-compliant performance the observance of a large number of boundary conditions, in particular with regard to the properties of the measurement arrangements (nature of the antennas used, position of the measurement axes, measurement distances, size of the test volume etc.) and with regard to the properties of the test chamber (properties of the wall and ceiling absorbers, use of floor absorbers etc.).

All the solutions known from the prior art therefore make provision for extensive modification work in the interior of the test chamber between the performance of the various validation tests and subsequently the various EMC measurement tests, said modification work including the installation and removal of test equipment (antennas, floor absorbers or floor absorber fields), because otherwise standard-compliant measurements cannot be carried out on account of the mutual influencing of the test equipment.

These modifications are very complex, time-consuming and cost-intensive. There is the risk of the sensitive test equipment thereby being damaged. The measurement quality can also change as a result of the installation and removal of test equipment, so that a reliable reproducibility of measurement results is not always guaranteed.

BRIEF SUMMARY OF THE INVENTION

It is an object of the present invention to simplify the EMC measurement test in a suitable test chamber. In particular, the performance of different EMC measurement tests in a single test chamber is intended to be simplified. These objects are solved by a test chamber as claimed and by the method as claimed.

Accordingly, the test chamber according to the invention for the EMC measurement test is designed for performing different EMC measurement test procedures by providing a plurality of measurement arrangements with different measurement axes. A plurality of antennas is simultaneously arranged in the test chamber, wherein each of these antennas is assigned in each case to at least one of the measurement test procedures. In order to provide the measurement arrangement for the given measurement test procedure, each of these antennas can be moved from a rest position into a measurement position assigned to this measurement arrangement and back again.

The method according to the invention for the validation of such a test chamber is characterized in that, in order to provide a measurement arrangement to be validated, one of these antennas is in each case located in a measurement position assigned to this measurement arrangement during the validation of said test chamber, whilst the other antennas are each located in their rest positions differing from their measurement positions.

The method according to the invention for operating such a test chamber for the EMC measurement test is characterized in that different EMC measurement test procedures are carried out in the test chamber, whereby a plurality of measurement arrangements with different measurement axes is successively provided, wherein a plurality of antennas is simultaneously arranged in the test chamber, wherein each of these antennas is assigned in each case to at least one of the measurement test procedures and wherein, in order to provide the measurement arrangement for the given measurement test procedure, in each case one of these antennas is moved from a rest position into a measurement position assigned to this measurement arrangement.

Advantageous embodiments of the invention are stated in the sub-claims.

The advantages and developments explained below in connection with the test chamber also apply analogously to the methods according to the invention and vice versa.

It is a basic idea of the invention to provide a plurality of measurement arrangements with different measurement axes for performing different EMC measurement test procedures in one and the same test chamber. In other words, a plurality of measurement arrangements with measurement axes differing from one another can be implemented in such a "hybrid" test chamber according to the invention. Three measurement axes with a measurement distance of for example 3 to 10 meters are preferably accommodated in a single test chamber. The test chamber is preferably designed as a semi anechoic chamber. In this way, the entire spectrum of the immunity measurement and emission measurement can be covered using a single such test chamber. The switch between the different measurement arrangements takes place by the fact that the corresponding components of the test equipment, in particular antennas and if applicable floor absorbers, are moved from a rest position into the required measurement position. When mention is made here of floor absorbers, these are usually floor absorber fields. The movement of the antennas and floor absorbers takes place either manually or in an automated manner. In the case of a fully automated solution, therefore, an automatic test run of one or more measurement test procedures can also be carried out in a particularly straightforward manner. Even with a purely manual execution, however, the procedural sequence between the individual measurement tests is simplified.

A validation of the test chamber according to the invention always takes place before the actual EMC measurement tests. All the measurement arrangements provided by the test chamber are checked for compliance with the known validation standards. To this end, the antennas and floor absorbers to be tested in each case are located in their measurement positions, whilst those antennas and floor absorbers that are not at the moment undergoing a test are located in their rest positions. These validated ("tested") measurement arrangements form the basis for the subsequent standard-compliant EMC measurement test. A validation of all the measurement arrangements can take place at the time of an overall validation of the test chamber, but individual measurement arrangements can also be validated at greater time intervals.

With the present invention, an EMC measurement test is possible wherein an expensive modification of the test field and the test set-up is not required. The entire test equipment can remain permanently, i.e. even during the performance of all the measurement test procedures, in the connected state in the test chamber. It is not only long modification times that are unnecessary. Since installation and removal of test equipment into and from the test chamber is no longer required, there is also no need to hold in reserve external storage space for equipment not required at the time.

Damage to the test equipment due to frequent handling and transportation is virtually eliminated. In principle, the same also applies to operating errors, since measurement and rest positions, once they are defined, are occupied unchanged. It is thus easily ensured that the measurement tests are reproducible and the quality of the tests remains constant. As a result, the EMC measurement test, compared to the conventional technique, is greatly simplified and all the required measurement test procedures can be carried out more quickly and more efficiently.

Compared to conventional measurement sites, particularly space-saving solutions with very compact test chambers are also possible as a result of the invention, even if the latter have an irregular shape, in particular an irregular ground plan. With the present invention, a plurality of measurement arrangements and therefore a plurality of measurement axes can be accommodated in a single test chamber in a standard-compliant manner, even if irregular, asymmetrical chambers are involved. In other words, the arrangement of the antennas and floor absorbers or floor absorber fields in the test chamber and therefore the positioning of different measurement arrangements can be carried out corresponding to the shape of the test chamber. To put it another way, the invention not only permits asymmetric test chambers to be used, but also at the same time enables the arrangement of a plurality of measurement arrangements in one test chamber, as a result of which the performance of the EMC measurement tests, but also the prior validation of the test chamber, is greatly simplified compared to conventional solutions.

On account of the greater freedom of choice of the geometry of the test chamber compared to conventional solutions, additional shielded chambers, such as control or amplifier chambers for example, can be provided for the implementation of the invention without a larger building thus being required, than in the case of conventional test chamber geometry. With the aid of the present invention, moreover, changing spatial conditions can also easily be reacted to, for example when the test chamber is to be increased or reduced in size. As a result of the adaptability of the measurement arrangements to the new circumstances that is made possible individually, the concept of the multiple measurement axes in one test chamber can also be implemented when there are changes in size and shape.

According to the present invention, the test chamber, which can also be referred to for example as an absorber chamber or absorber hall, is designed as a so-called semi anechoic chamber. In contrast with a fully anechoic chamber, in which all the wall, floor and ceiling surfaces are provided with absorbers, the floor of the semi anechoic chamber is lined with a fully reflecting metal plate (ground plane).

The test chamber according to the invention is designed for performing different EMC measurement test procedures. This takes place by the successive provision of a plurality of measurement arrangements with different measurement axes. Two or more, but in particular three different measurement arrangements can be implemented alternately one after the other in a standard-conformant manner in one and the same test chamber. This concerns in particular the measurement arrangements for emission and immunity. Each of these measurement arrangements has its own measurement axis, which is intersected in each case by the measurement axes of the other measurement arrangements. In other words, three measurement axes find space in the interior of the test chamber, which, as will be described in greater detail below, are arranged in a particular manner with respect to one another.

A plurality of antennas differing from one another and corresponding to the relevant test standards are permanently arranged in the interior of the test chamber. This means that these antennas remain in the test chamber during the performance of the different measurement test procedures. Installation or replacement of the antennas between the different measurement tests does not take place. Three different antennas are preferably provided in the test chamber. Depending on the measurement test procedure, an antenna can also be understood to mean a combination of a plurality of antennas, in particular in the form of antenna pairs. Depending on the measurement test procedure, it may also involve transmission antennas and/or reception antennas.

In order to implement the required measurement arrangement for the given measurement test procedure, each of these antennas can be moved from a defined rest position (parking position), in which the antenna is not used, into at least one defined measurement position assigned to the given measurement arrangement, and back again.

Depending on the embodiment of the test chamber, the antennas can be moved in each case between their rest and measurement position manually, semi-automatically or fully automatically. The movement of the antennas takes place in accordance with the standards, in particular horizontally. The movement of the antennas preferably involves a displacement of the corresponding components along a guide rail or with the aid of another suitable guide device. Depending on the embodiment, however, a free movement of the antennas is also possible without the aid of a separate component serving as a guide element inside the test chamber.

As already stated above, the invention enables the permanent, unified accommodation of the measurement equipment for three EMC measurement test procedures in the smallest possible space with the least possible mutual influencing, interference and electrical excitation. To achieve this, all the antennas that are not required at the time for the performance of the current measurement test procedure are located in their rest position inside the test chamber, in which they are located as far away as possible both from the test volume, in particular the test-piece, as well as from the currently active antenna. Both the measurement position of the active antenna and the position of the test volume in the test chamber as well as the location of the rest positions of all the other components are selected with due regard to compliance with all the relevant test standards, in such a way that the distances and the angles between these objects are at a maximum. In other words, the antennas in particular, but also all the other components of the test equipment, are positioned and orientated according to the predefined or available spatial circumstances and the resultant properties of the space, in particular the spatial dimensions and the spatial geometry, in such a way that mutual influencing is in each case at a minimum during the performance of the different measurement test procedures. The geometry of the space, in particular, determines the optimum position of the measurement axes and therefore a defined layout of the test chamber with specific measurement and rest positions of antennas and floor absorbers. The positions of the measurement axes inside the spatial volume of the test chamber result therefrom.

For the performance of the aforementioned measurement test procedures for emission and immunity, three measurement arrangements with three different measurement axes are provided, wherein the measurement axis running between the antenna and the centre-point of the test volume is defined, amongst other things, by the orientation of the antenna to the test-piece, the distance of the antenna from the test-piece and its position in the interior of the test chamber. A star-shaped, in particular Y-shaped arrangement of the measurement axes with one longer and two shorter measurement axes, corresponding to the lengths of the standard-compliant test distances, results therefrom, wherein the measurement axes intersect in the centre of the test volume. In other words, the antennas are not directed towards one another. Assuming a sufficiently large available space, the three measurement axes are located at the greatest possible angular distance from one another, wherein the rest positions of the non-active antennas are also located at the greatest possible distance from the measurement position of the active antenna and from the centre of the test volume, in each case in compliance with the relevant standards. Depending on the spatial size and the shape of the test chamber, angular distances between the measurement axes diverging from these maximum distances or distances diverging from the maximum distances can be provided, as long as a standard-compliant measurement environment emerges as a result. The test standards relevant to EMC measurement tests are, in detail, standards CISPR 16-2-3/EN55016-2-3, CISPR 22/EN 55022, CISPR 11/EN 55011, CISPR 14-1/EN 55014-1 and CISPR 32/EN 55032 for the emission tests and standard IEC/EN 61000-4-3 for the immunity tests.

The invention is not restricted to the provision of three measurement arrangements. Another plurality of measurement arrangements can also be provided, in particular with more than one measurement axis. The arrangement of the measurement axes also does not necessarily have to be Y-shaped. Depending on the number of the required measurement axes, another star-shaped arrangement may also be advantageous, for example an X-shaped arrangement of the measurement axes. If the size of the test chamber is sufficient, several groups of measurement arrangements can be accommodated in the interior of one test chamber, if mutual influencing of the different groups of measurement arrangements can be ruled out. Thus, for example, a first group of measurement arrangements with three measurement axes arranged Y-shaped and a second group of measurement arrangements with three further measurement axes arranged Y-shaped can be provided in a test chamber.

If floor absorbers or floor absorber fields are used, corresponding to the given measurement test procedure, the latter are preferably moved and positioned exactly like antennas. The standard-compliant floor absorbers assigned in each case to one of the measurement test procedures are thus moved from a rest position inside the test chamber into their respective measurement position to provide the measurement arrangement for the given measurement test procedure. Meanwhile, floor absorbers that are not required are located in their rest position, which is selected such that it is suitable as a holding location without adversely affecting the test chamber properties. In other words, the test chamber according to the invention enables variable floor absorber areas that can be configured individually for each measurement axis. As already described in reference to the antennas, the measurement and rest positions of the floor absorbers are also selected such that influencing of the other components of the test equipment is at a minimum, but at all events satisfies the relevant standards.

Moreover, the test chamber according to the invention is preferably characterized in that the movement of the antennas or floor absorber fields inside the test chamber takes place along defined paths, in particular along the measurement axes. It is very particularly advantageous if these movements take place exclusively along defined paths, in particular exclusively along the measurement axes. In other words, each of the antennas and/or each of the floor absorbers can preferably be moved inside the test chamber from its rest position into its measurement position and back along one and the same measurement axis of the measurement arrangement of the given measurement test procedure. In other words, the course of the measurement axes defines the movement axes for antennas and floor absorbers. To put it another way, the course of the measurement axes follows the movement axes of the antennas or floor absorber fields. With regard to the antennas, "along the measurement axis" (axial) means that the movement of the antennas takes place in the measurement axis. With regard to the floor absorbers arranged on the floor of the test chamber, on the other hand, it means that the floor absorbers are moved parallel to the measurement axis. In particular, since floor absorbers and antennas can thus be exactly positioned repeatedly, a high degree of reproducibility of the measurement tests is produced. A movement of the antennas on the measurement axes at the same time makes it easier to create the required measurement distances with test-pieces of differing size.

In this connection, a movement of the antennas or floor absorbers "along a measurement axis" is always to be understood to mean that, whilst the movement direction corresponds to the direction of the measurement axis, the extent of the movement is not thereby limited by the length of the measurement axis. In other words, the movement of the antennas or floor absorbers can also take place beyond the aforementioned fixed points (measurement position of the antenna, centre of the test volume) in an extension of the measurement axis, in particular in the case of a movement of the components into their rest positions.

An embodiment of the invention is particularly advantageous wherein the antennas and floor absorbers respectively assigned to one of the measurement test procedures can be moved from their rest position into their measurement position and back independently of one another, but in the same direction, i.e. preferably along the measurement axis assigned to them in each case. Such a movement of antennas and floor absorbers independently of one another permits in a straightforward manner the standard-compliant performance of the measurement test procedures even with different test volumes or test-pieces and different measurement distances required as a result. A movement of the antennas and floor absorbers taking place independently of one another can however also take place in a different direction.

In another embodiment of the invention, it may be advantageous if antennas and floor absorbers cannot be moved independently of one another, but instead can only be moved with one another. In this case, antenna and absorber preferably form a structural unit. For example, an antenna is screwed to a floor absorber or floor absorber field suitable for the formation of the corresponding measurement arrangement.

In alternative embodiments of the invention, however, the antennas and/or floor absorbers or floor absorber fields can also be moved into their measurement position in a different way, for example offset with respect to the measurement axes, swiveling in from the side, moving down from above or moving up from below. In particular, a non-axial displacement of the floor absorbers into the respective measurement or rest position can thus also take place, for example by reason of a special predetermined test chamber geometry.

The movement of the antennas and/or the floor absorbers or floor absorber fields between their positions can take place for example on rails provided for the purpose. Instead of the rails, however, other traversing means can also be used, for example rollers, which are fixed to the antennas or to the absorbers. The traversing paths are not thereby specified in all the embodiments of the invention. A free movement of antennas and/or absorbers inside the test chamber is also possible.

In further embodiments of the invention, not all antennas and not all floor absorbers or floor absorber fields are permanently arranged in the test chamber. The basic idea of the invention of providing a plurality of measurement arrangements with different measurement axes for performing different EMC measurement test procedures in one and the same test chamber can also be implemented in the case of systems in which antennas and/or absorbers can not only be moved inside the test chamber, but can also be moved out of the test chamber and into the test chamber. In other words, rest positions of antennas and absorbers can also be provided outside the test chamber. Preferably, however, at least the floor absorber or the floor absorber field is permanently located inside the test chamber in order to minimize the distance that has to be covered by these usually comparatively heavy system components.

An example of embodiment of the invention will be explained in greater detail below with the aid of the drawings. In the figures:

BRIEF DESCRIPTION OF THE SEVERAL VIEWS OF THE DRAWING

FIG. 1 shows a test chamber with three measurement axes, in plan view,

FIG. 2 shows the test chamber from FIG. 1, designed for an emission test, in plan view, FIG. 3 shows the test chamber from FIG. 2, designed for an emission test and an immunity test in a first frequency range, in plan view, FIG. 4 shows the test chamber from FIG. 2, designed for an immunity test in a second frequency range, in plan view.

DESCRIPTION OF THE INVENTION

All the figures show the invention not true to scale, only diagrammatically and only with its essential components.

Identical reference numbers correspond to elements having an identical or comparable function.

FIG. 1 shows a diagrammatic sketch of an embodiment of a test chamber 1 according to the invention in plan view. Test chamber 1 is designed for the performance of EMC measurement tests.

Test chamber 1 defined in its geometry by the local structural circumstances has for example the ground plan of a convex pentagon, which is obtained by the fact that a corner point 2 of an originally rectangular space has been shifted in the direction of a corner point 3 adjacent to it, this being done however with an inclined position of only a section of a longitudinal side 4 of the space that adjoins this corner point 2, in such a way that the resultant space, proceeding from a first head end 5, at first has a first spatial section 6 of constant width, see FIG. 1. This first spatial section 6 is followed by a second spatial section 7, the width whereof, starting with the inclined position of the one longitudinal side 4, continuously diminishes up to opposite second head end 8 of the space.

The walls and the ceiling of test chamber 1 are provided in a known manner with suitable absorbers 9 for electromagnetic waves (for reasons of clarity, only indicated in FIG. 1). Provided in a central region of test chamber 1 is test volume 11, i.e. the region in which a test-piece 10 is arranged during the measurements. Test volume 11 is still primarily located in first spatial section 6 of test chamber 1. A rotary disc for the standard-compliant positioning of the test-piece is often provided. During an EMC measurement test, test-piece 10 is positioned, in accordance with the test standards, in the centre 12 of test volume 11.

Three basic measurement arrangements 13, 14, 15 are implemented in test chamber 1, see FIG. 2, 3, 4, the measurement axes thereof, differing from one another, being arranged star-shaped, more precisely Y-shaped, and meeting in the centre 12 of test volume 11. There is a first measurement axis 16, which serves to test the emission in a first frequency range, a second measurement axis 17, which serves to test the emission in a second frequency range and to test the immunity in a first frequency range, and a third measurement axis 18, which serves to test the immunity in a second frequency range.

In order to implement the measurement arrangements, a plurality of antennas 31, 32, 33, 34 and floor absorber fields 21, 22 is present in the test chamber. As will be explained in greater detail below, only three antennas 31, 32, 34 are required in a preferred embodiment of the invention, since the same antennas 32, 33 can be used to measure the same frequency range.

In test chamber 1 discussed here by way of example, first measurement axis 16 is slightly inclined, diverging from the central longitudinal axis of the space, positioned roughly bisecting the space tapering towards second head end 8, whilst second measurement axis 17 and third measurement axis 18 extend, proceeding from the centre 12 of test volume 11, in the direction of the two rectangular corners 19, 20 of first spatial section 6, said rectangular corners limiting first head end 5, see FIG. 1.

The arrangement of measurement axes 16, 17, 18 and therefore the definition of the measurement and rest positions takes place in such a way that, in compliance with the relevant standards for the given measurement test procedures, the mutual influencing is at a minimum and all the components of the test equipment can remain in the interior of test chamber 1. Accordingly, the rest positions of antennas 31, 32, 33, 34 and floor absorber fields 21, 22 are ideally located in each case in the regions of test chamber 1 farthest away from the centre 12 of test volume 11, i.e. in this case in the region of second head end 8 provided distant from test volume 11 or in the two aforementioned corners 19, 20 of first spatial section 6.

The performance of the EMC measurement test is described below using an example.

Measurement arrangement 13 for the emission test in the frequency range from 30 MHz to 1 GHz is represented in FIG. 2. In the case of a measurement distance of three meters, standard-compliant first antenna 31 required for this is located in a first measurement position 24, three meters away from test-piece 10, on first measurement axis 16. For the measurement at a measurement distance of ten meters, first antenna 31 is located in a second measurement position 25, ten meters away from test-piece 10. Floor absorber fields 21, 22 are not used. During the emission measurement, non-active antennas 32, 33, 34 and floor absorber fields 21, 22 are located in their rest positions 42, 43, 44, 53, 55. After completion of the emission test, first antenna 31 is moved along first measurement axis 16 into its rest position 41, which is located behind second measurement position 25 in an imaginary extension of first measurement axis 16 and therefore as far away as possible from the centre 12 of test volume 11, as illustrated in FIGS. 3 and 4.

Measurement arrangement 14 for the emission test in the frequency range from 1 GHz to 18 GHz is represented in FIG. 3. Second antenna 32 required for this is located in its measurement position 26 on second measurement axis 17. First floor absorber field 21 designed for this test is located in its measurement position 51, with its front edge directly at test-piece 10. The distance of second antenna 32 from test-piece 10 amounts to three meters. During the emission test, non-active antennas 31, 33, 34 and second floor absorber field 22 are located in their rest positions 41, 43, 44, 55. After completion of the test, second antenna 32 is moved along second measurement axis 17 into its rest position 42, which is located behind its measurement position 26 in an imaginary extension of second measurement axis 17 and therefore as far away as possible from the centre 12 of test volume 11, as illustrated in FIGS. 2 and 4.

In its rest position 42, second antenna 32 is arranged behind an additional wall 23 provided with standard absorbers 9, provided for this purpose. Additional wall 23 serves to cover the rest position and comprises an opening for introducing and removing antenna 32, 33 and the floor absorber field 22. First floor absorber 21 is also moved along second measurement axis 17 into its rest position 53, which is located behind its measurement position 51 in an imaginary extension of second measurement axis 17 and therefore as far away as possible from the centre 12 of test volume 11, as illustrated in FIGS. 2 and 4. First floor absorber field 21 is located in its rest position 53 also at least partially behind additional wall 23.

The same measurement arrangement 14 represented in FIG. 3 is used for the immunity test in the frequency range from 1 GHz to 18 GHz. It should be stressed that the same antenna 32 is preferably used. Another suitable third antenna 33 can however also be used. Measurement and rest positions 27, 43 of third antenna 33 correspond to measurement and rest positions 26, 42 of second antenna 32. In the implementation of measurement arrangement 14, first floor absorber field 21 is again used. Its measurement and rest positions 51, 53 remain unchanged.

Measurement arrangement 15 for the immunity test in the frequency range from 80 MHz to 1 GHz is represented in FIG. 4. Standard-compliant fourth antenna 34 required for this is located in its measurement position 28 on third measurement axis 18, three meters away from the test-piece. Second floor absorber field 22 designed for use in this measurement is located in its measurement position 54, with its front edge directly at test-piece 10. During this immunity test, non-active antennas 31, 32, 33 and first floor absorber field 21 are located in their rest positions 41, 42, 43, 53. After completion of this measurement, fourth antenna 34 is moved along third measurement axis 18 into its rest position 44, which is located behind its measurement position 28 in an imaginary extension of third measurement axis 18 and therefore as far away as possible from the centre 12 of test volume 11, as illustrated in FIGS. 2 and 3. Second floor absorber field 22 is also moved along third measurement axis 18 into its rest position 55, which is located behind its measurement position 54 in an imaginary extension of third measurement axis 18 and therefore as far away as possible from the centre 12 of test volume 11, as illustrated in FIGS. 2 and 3.

So much for the description of the EMC measurement test. Although measurement arrangements 13, 14, 15 illustrated in FIGS. 2, 3 and 4 were previously described in relation to the EMC measurement test inside test chamber 1, this structure nonetheless essentially corresponds to the measurement arrangements in the performance of corresponding validation measurements for validating test chamber 1. The same applies to the measurement and rest positions of antennas 31, 32, 33, 34 and floor absorbers 21, 22 described above. Thus, first measurement arrangement 13 can be used in the performance of the NSA test procedure, second measurement arrangement 14 in the performance of the SVSWR test procedure and in the measurement of the field uniformity in a first frequency range, and third measurement arrangement 15 in the measurement of the field uniformity in a second frequency range.

Antennas 31, 32, 33, 34 are usually height-adjustable and, in an example of embodiment, traversable on guide rails (not represented) along their measurement axes. For the movement of antennas 31, 32, 33, 34 and floor absorbers 21, 22, use can be made of electromotive drives provided with suitable controls or other suitable means.

All the features set out in the description, the following claims and the drawing may be essential to the invention both individually as well as in any desired combination with one another.

LIST OF REFERENCE NUMBERS 1 test chamber
2 corner point
3 corner point
4 longitudinal side with inclined section
5 first head end
6 first spatial section
7 second spatial section
8 second head end 9 absorber
10 test-piece
11 test volume
12 centre of test volume
13 first measurement arrangement
14 second measurement arrangement
15 third measurement arrangement
16 first measurement axis
17 second measurement axis
18 third measurement axis
19 corner
20 corner
21 first floor absorber, first floor absorber field
22 second floor absorber, second floor absorber field
23 additional wall
24 first measurement position (emission measurement up to 1 GHz)
25 second measurement position (emission measurement up to 1 GHz)
26 measurement position (emission measurement over 1 GHz)
27 measurement position (immunity measurement over 1 GHz)
28 measurement position (immunity measurement up to 1 GHz)
29 (free)
30 (free)
31 first antenna
32 second antenna
33 third antenna
34 fourth antenna
41 rest position of the first antenna
42 rest position of the second antenna
43 rest position of the third antenna
44 rest position of the fourth antenna
51 measurement position of the first floor absorber
52 (free)
53 rest position of the first floor absorber
54 measurement position of the second floor absorber
55 rest position of the second floor absorber

The invention claimed is:

1. A test chamber assembly with a test chamber for electromagnetic compatibility (EMC) measurement testing with a plurality of measurement arrangements having mutually different measurement axes configured for performing different electromagnetic compatibility (EMC) measurement test procedures, the test chamber assembly comprising:
a plurality of antennas simultaneously disposed in the test chamber, each of said antennas being assigned to at least one of the EMC measurement test procedures; and each of said antennas being movably mounted between a rest position and a measurement position, wherein, in order to configure a respective said measurement arrangement for a given EMC measurement test procedure, a respective said antenna is moved from the rest position into the measurement position assigned to the measurement arrangement.

2. The test chamber assembly according to claim 1, wherein at least three different antennas are arranged in the test chamber, configured for performing a plurality of different EMC measurement test procedures by providing at least three measurement arrangements.

3. The test chamber assembly according to claim 1, wherein the measurement positions and rest positions of said antennas are defined taking account of properties of a space available inside the test chamber, and such that an angular distance and/or distance suitable for compliance with respective standards exists between said antennas located in their rest position on the one hand and the antenna located in its measurement position as well as a test-piece on the other hand, respectively.

4. The test chamber assembly according to claim 1, wherein the measurement positions of said antennas are selected to define the measurement axes of respective measurement arrangements to form a Y-shape relative to one another.

5. The test chamber assembly according to claim 1, which comprises a plurality of floor absorbers or floor absorber fields disposed in the test chamber and in each case assigned to at least one of the measurement test procedures, wherein, in order to provide a measurement arrangement for a given measurement test procedure, each of said floor absorbers or each of said floor absorber fields are movable from the rest position into the measurement position assigned to the respective said measurement arrangement and back into the rest position.

6. The test chamber assembly according to claim 5, wherein each of said antennas and/or each of said floor absorbers or each of said floor absorber fields is movably mounted along the measurement axis of the measurement arrangement of the respective measurement test procedure.

7. The test chamber assembly according to claim 1, wherein said antennas and floor absorbers or floor absorber fields, which are respectively assigned to one of the measurement test procedures can be moved independently of one another.

8. A method for validating a test chamber for an electromagnetic compatibility (EMC) measurement test, wherein the test chamber is configured for performing different electromagnetic compatibility (EMC) measurement test procedures by providing a plurality of measurement arrangements with different measurement axes, the method comprising:
simultaneously arranging a plurality of antennas in the test chamber and assigning each of the antennas to at least one of the EMC measurement test procedures;
in order to provide a given measurement arrangement to be validated, aligning one of the antennas in a measurement position assigned to the given measurement arrangement during the validation of the test chamber, while the other antennas are each located in their rest positions that differ from their measurement positions.

9. The method according to claim 8, wherein a plurality of floor absorbers or floor absorber fields are arranged in the test chamber, and each of the floor absorbers or each of the floor absorber fields is respectively assigned to at least one of the measurement test procedures, and wherein, for the purpose of validating the test chamber, moving in each case one of the floor absorbers or one of the floor absorber fields into a measurement position that is assigned to the measurement arrangement.

10. The method according to claim 8, wherein a plurality of floor absorbers or floor absorber fields are arranged simultaneously in the test chamber, and wherein each of the floor absorbers or each of the floor absorber fields is respectively assigned to at least one of the measurement test procedures and wherein, in order to provide a measurement arrangement to be validated, one of the floor absorbers or one of the floor absorber fields is in each case located in a measurement position assigned to the given measurement arrangement during the validation of the test chamber, while the other floor absorbers or floor absorber fields are each located in their rest positions that differ from their measurement positions.

11. A method for operating a test chamber for an electromagnetic compatibility (EMC) measurement test, the method comprising:
provide a test chamber for a plurality of different electromagnetic compatibility (EMC) measurement test procedures to be carried out in the test chamber;
successively providing a plurality of measurement arrangements with different measurement axes, wherein a plurality of antennas are simultaneously arranged in the test chamber, wherein each of the antennas is respectively assigned to at least one of the measurement test procedures; and
in order to provide the measurement arrangement for the respective measurement test procedure, moving one of the antennas from a rest position into a measurement position assigned to this measurement arrangement.

12. The method according to claim 11, which comprises maintaining the antennas not required at the time to provide the measurement arrangement for the given measurement test procedure in their respective rest positions or moving them into the respective rest positions.

13. The method according to claim 11, which comprises providing a plurality of floor absorbers or floor absorber fields in the test chamber and assigning each to at least one of the measurement test procedures, and which comprises, in order to provide the measurement arrangement for the given measurement test procedure, moving the floor absorbers or floor absorber fields from a rest position into a measurement position assigned to the respective measurement arrangement.

14. The method according to claim 13, which comprises maintaining the floor absorbers or floor absorber fields not required at the time for providing the measurement arrangement for the given measurement test procedure in their respective rest positions or moving them into the respective rest positions.

* * * * *